(12) United States Patent
Chu et al.

(10) Patent No.: US 8,530,978 B1
(45) Date of Patent: Sep. 10, 2013

(54) HIGH CURRENT HIGH VOLTAGE GAN FIELD EFFECT TRANSISTORS AND METHOD OF FABRICATING SAME

(75) Inventors: Rongming Chu, Calabasas, CA (US);
Zijian "Ray" Li, Oak Park, CA (US);
Karim S. Boutros, Moorpark, CA (US);
Shawn Burnham, Oxnard, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 13/312,406

(22) Filed: Dec. 6, 2011

(51) Int. Cl.
*H01L 29/66* (2006.01)

(52) U.S. Cl.
USPC ........... 257/409; 257/289; 257/192; 257/194; 257/401; 438/191; 438/590

(58) Field of Classification Search
USPC ................. 257/289, 192–194, 401, 622, 630, 257/409; 438/191, 590
See application file for complete search history.

(56) References Cited

U.S. PATENT DOCUMENTS

| | | | | |
|---|---|---|---|---|
| 3,767,981 A * | 10/1973 | Polata | ............................ | 257/488 |
| 5,661,318 A * | 8/1997 | Nashimoto | .................... | 257/279 |
| 6,215,152 B1 * | 4/2001 | Hebert | ........................... | 257/340 |
| 7,045,404 B2 * | 5/2006 | Sheppard et al. | ............. | 438/191 |
| 7,573,078 B2 | 8/2009 | Wu | | |
| 7,671,383 B2 * | 3/2010 | Hayashi et al. | ................ | 257/192 |
| 7,728,355 B2 * | 6/2010 | Beach et al. | ................... | 257/194 |
| 7,800,132 B2 * | 9/2010 | Smorchkova et al. | ........ | 257/194 |
| 8,169,005 B2 * | 5/2012 | Wu et al. | ........................ | 257/194 |
| 8,237,198 B2 * | 8/2012 | Wu et al. | ........................ | 257/194 |
| 2001/0023964 A1 * | 9/2001 | Wu et al. | ........................ | 257/368 |
| 2003/0151093 A1 * | 8/2003 | Rumennik et al. | ............. | 257/343 |
| 2004/0061129 A1 * | 4/2004 | Saxler et al. | ................... | 257/192 |
| 2005/0098846 A1 * | 5/2005 | Nagaoka | ........................ | 257/487 |
| 2005/0285189 A1 * | 12/2005 | Shibib et al. | ................... | 257/341 |
| 2006/0017064 A1 | 1/2006 | Saxler | | |
| 2006/0108606 A1 | 5/2006 | Saxler | | |
| 2006/0249750 A1 * | 11/2006 | Johnson et al. | ................ | 257/192 |
| 2007/0138551 A1 * | 6/2007 | Ko | .................. | 257/343 |
| 2007/0164322 A1 | 7/2007 | Smith | | |
| 2007/0164326 A1 * | 7/2007 | Okamoto et al. | .............. | 257/288 |
| 2007/0194354 A1 * | 8/2007 | Wu et al. | ........................ | 257/288 |
| 2007/0235775 A1 * | 10/2007 | Wu et al. | ........................ | 257/288 |
| 2009/0042345 A1 * | 2/2009 | Saxler et al. | ................... | 438/172 |
| 2011/0127604 A1 * | 6/2011 | Sato | .............................. | 257/332 |
| 2011/0140172 A1 | 6/2011 | Chu | | |
| 2011/0297958 A1 * | 12/2011 | Kub et al. | ........................ | 257/76 |

OTHER PUBLICATIONS

H. Xing, Y. Dora, A. Chini, S. Heikman, S. Keller, and U. k. Mishra, "High breakdown voltage AlGaN-GaN HEMTs Achieved by Multiple Field Plates," IEEE Electron Dev. Lett., vol. 25, No. 4, Apr. 2004.

Y. Pei, Z. Chen, D. Brown, S. Keller, S. P. Denbaars, and U. K. Mishra, "Deep-Submicrometer AlGaN/GaN HEMTs With Slant Field Plates", IEEE Electron Dev. Lett., vol. 30, No. 4, Apr. 2009.

Y. Dora, A. Chakraborty, L. McCarthy, S. Keller, S. P. Denbaars, and U. K. Mishra, "High Breakdown Voltage Achieved on AlGaN/GaN HEMTs with Integrated Slant Field Plates", IEEE Electron Dev. Lett., vol. 27, No. 9, Sep. 2006.

PCT International Search Report and Written Opinion for PCT Application No. PCT/US2012/038013 mailed on Feb. 21, 2013 (8 pages).

* cited by examiner

*Primary Examiner* — N Drew Richards
*Assistant Examiner* — Ankush Singal
(74) *Attorney, Agent, or Firm* — Ladas & Parry

(57) ABSTRACT

A field effect transistor (FET) having a source contact to a channel layer, a drain contact to the channel layer, and a gate contact on a barrier layer over the channel layer, the FET including a dielectric layer on the barrier layer between the source contact and the drain contact and over the gate contact, and a field plate on the dielectric layer, the field plate connected to the source contact and extending over a space between the gate contact and the drain contact and the field plate comprising a sloped sidewall in the space between the gate contact and the drain contact.

20 Claims, 5 Drawing Sheets

HIGH CURRENT HIGH VOLTAGE GAN FIELD EFFECT TRANSISTORS AND METHOD OF FABRICATING SAME

CROSS REFERENCE TO RELATED APPLICATIONS

None

TECHNICAL FIELD

This disclosure relates to field effect transistors (FETs), and in particular to high voltage gallium nitride (GaN) devices.

BACKGROUND

In a field effect transistor, the ability to engineer or shape the electric field at the drain edge of the gate is critical for reducing the device dynamic on-resistance and increasing the device breakdown voltage, which are two key parameters for high voltage GaN devices.

In the prior art, various approaches to modifying the electric field have been described. H. Xing, Y. Dora, A. Chini, S. Heikman, S. Keller, and U. k. Mishra, "High breakdown voltage AlGaN-GaN HEMTs Achieved by Multiple Field Plates," IEEE Electron Dev. Lett., vol. 25, no. 4, April 2004describes multiple field plate devices to enhance the breakdown voltage. Flat field plates and combinations of flat field plates are also described in U.S. Pat. No. 7,573,078 B2, "Wide bandgap transistors with Multiple Field Plates" to Wu et al.

In the prior art, the use of a gate connected slanted field plate is described by Y. Pei, Z. Chen, D. Brown, S. Keller, S. P. Denbaars, and U. K. Mishra, "Deep-Submicrometer AlGaN/GaN HEMTs With Slant Field Plates", IEEE Electron Dev. Lett., vol. 30, no. 4, April 2009. A paper by Y. Dora, A. Chakraborty, L. McCarthy, S. Keller, S. P. Denbaars, and U. K. Mishra, "High Breakdown Voltage Achieved on AlGaN/GaN HEMTs with Integrated Slant Field Plates", IEEE Electron Dev. Lett., vol. 27, no. 9, September 2006, also describes gate connected slant field plates to reduce the peak electric field for high voltage breakdown operation.

Slanted structures have advantages but are difficult to fabricate using traditional photolithography techniques, and have not been widely used. Further, a disadvantage of a gate connected field plate is higher device Miller capacitance and higher parasitic source resistance, both of which are undesirable.

What is needed is an improved field plate and method for fabricating an improved field plate. This is particularly needed for GaN-based transistors due to the unique difficulties of surface passivation and traps in the Group III-nitride materials, which can be exacerbated by a non-uniform electric field between the gate and drain. What would be desirable is to optimize the electric field between the gate and drain of the device to reduce the dynamic on-resistance and enhance the breakdown voltage, while lowering the device Miller capacitance and the parasitic source resistance. The embodiments of the present disclosure answer these and other needs.

SUMMARY

In a first embodiment disclosed herein, a field effect transistor (FET) having a source contact to a channel layer, a drain contact to the channel layer, and a gate contact on a barrier layer over the channel layer, the FET comprising a dielectric layer on the barrier layer between the source contact and the drain contact and over the gate contact, and a field plate on the dielectric layer, the field plate connected to the source contact and extending over a space between the gate contact and the drain contact and the field plate comprising a sloped sidewall in the space between the gate contact and the drain contact.

In another embodiment disclosed herein, a method of forming a field plate for a field effect transistor having a source contact to a channel layer, a drain contact to the channel layer, and a gate contact on a barrier layer over the channel layer, the method comprising forming a dielectric layer on the barrier layer between the source contact and the drain contact and over the gate contact, coating photo resist on the dielectric, exposing the photo resist to illumination through a mask adapted to provide a tapered illumination intensity to the photo resist between the gate contact and the drain contact, developing and removing the exposed photo resist, leaving photo resist with a first sloped sidewall pattern between the gate contact and the drain contact, etching the dielectric and the remaining photo resist with the first sloped sidewall pattern to transfer the first sloped sidewall pattern to the dielectric to create a second sloped sidewall pattern on the dielectric between the gate contact and the drain contact, and depositing metal on the dielectric to form a field plate connected to the source contact and having third sloped sidewall between the gate contact and the drain contact.

These and other features and advantages will become further apparent from the detailed description and accompanying figures that follow. In the figures and description, numerals indicate the various features, like numerals referring to like features throughout both the drawings and the description.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Figure 1:
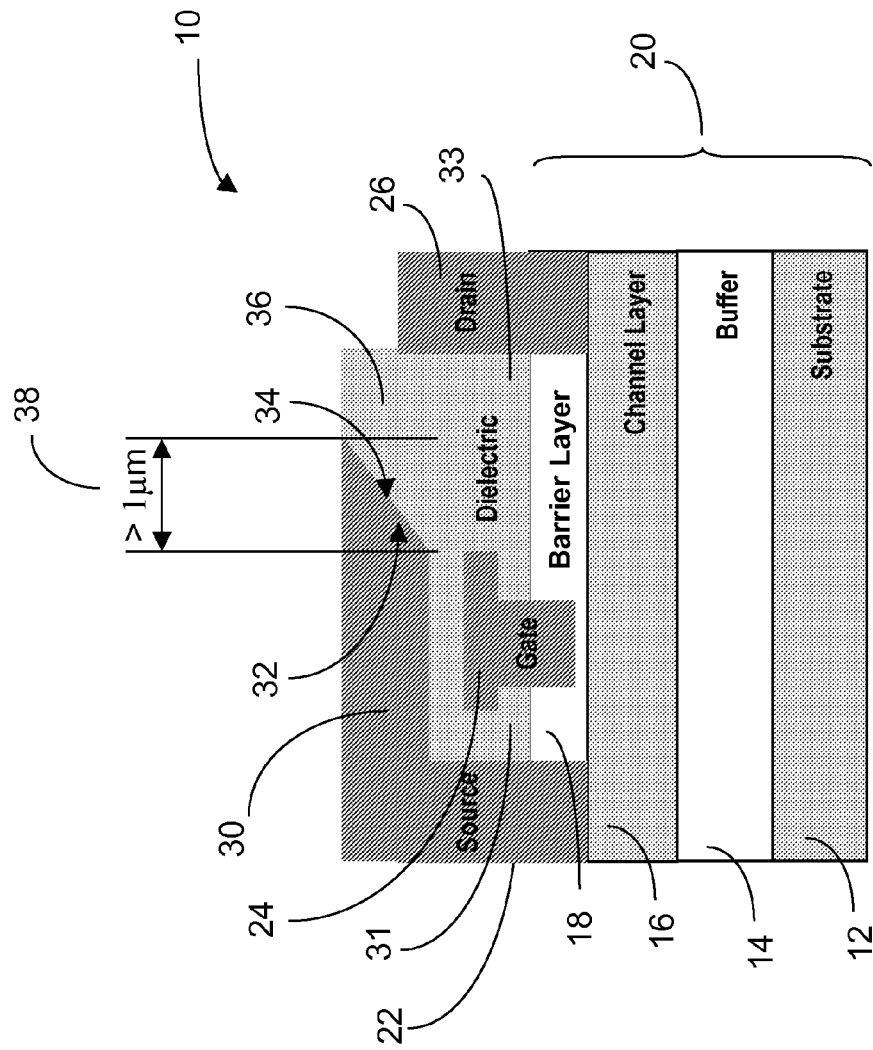
FIG. 1 shows an elevation sectional view of a FET with a source connected slant field plate in accordance with the present disclosure.

FIG. 1 shows an elevation sectional view of a FET 10 fabricated in accordance with the present disclosure. The layers 20 of the FET 10 may be the same as the conventional layers for any FET. A buffer layer 14 may be between a channel layer 16 and the substrate 12, as is well known in the prior art. The source 22 and the drain 26 are coupled to the channel layer 16. A barrier 18 overlays the channel layer 16 between the source 22 and the drain 26 and is between the gate 24 and the channel layer 16. The gate 24 is capacitively coupled to the channel layer 16, all of which is well known in the prior art.

In one embodiment the layers 20 may comprise the layers used for a GaN device, such as a GaN power switching device. The barrier layer 18 may be formed of AlGaN, AlN, or AlInN. The channel layer 16 may be formed of GaN or may be formed of InN, or InGaN. The dielectric 36 may be SiN, $Al_2O_3$, hafnium oxide ($HfO_2$), titanium oxide ($TiO_2$), $SiO_2$, amorphous AlN, or polycrystalline AlN. The metal for the source 22, gate 24, and drain 26 contacts, and the field plate 30 may be gold (Au), copper (Cu) or aluminum (Al) or any other suitable metal.

As shown in FIG. 1, a dielectric 36 on the barrier layer 18 covers the space between the source 22 and the drain 26 including the trenches 31 and 33. The dielectric 36 extends over the gate 24 and has a sloped sidewall 32 in the space between the gate 24 and the drain 26. A field plate 30 is physically and electrically connected to the source 22 and extends over and above the dielectric 36. The source 22 and the field plate 30 are conductive and preferably a metal. The field plate 30 is insulated from the gate 24 and the drain 26 by the dielectric 36. The field plate has a slanted or sloped sidewall 34 in the space between the gate 24 and the drain 26. In one embodiment the lateral dimension 38 of the sloped sidewall 34 between the gate 24 and the drain 26 is at least 1 micrometer. The sloped sidewall 34 is sloped in such a manner that near the gate 24 the sloped sidewall 34 is relatively close to the electron supply layer 18, and near the drain 26 the sloped sidewall 34 is relatively further away from the electron supply layer 18. The angle of the sloped sidewall 34 is typically 30 degrees relative to a plane of the barrier layer or electron supply layer 18 and may be as high as 90 degrees. Preferably the angle is about 30 degrees.

Variations on the sloped sidewall 34 may be fabricated. For example the sloped sidewall 34 may have a curvature.

The field plate connected to the source 22 provides a larger width for the source interconnect metal which has the effect of reducing the source resistance.

The sloped sidewall 34 shapes the electric field between the gate 24 and the drain 26, which has the effect of increasing the breakdown voltage and suppressing detrimental electron trapping. The field plate 30 with the sloped sidewall 34 can optimize the electric field continuously between the gate 24 and the drain 26, which can significantly reduce dynamic on-resistance and increase the voltage at which breakdown occurs, known as the breakdown voltage, which are two key parameters limiting the performance of prior art GaN high voltage devices.

FIGS. 2A-2D show a method of forming a source connected slant field plate in accordance with the present disclosure. The method uses gray scale lithography to form the sloped sidewall 34 on the field plate 30.

Figure 2A:
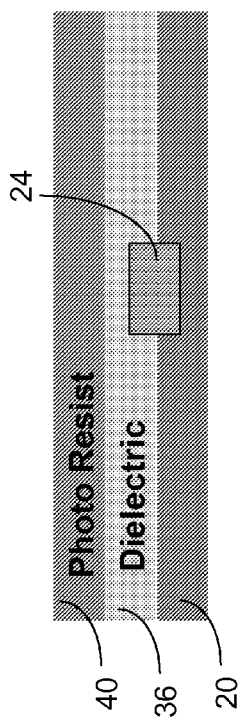
FIGS. 2A-2D show a method of forming a source connected slant field plate in accordance with the present disclosure.
Figure 2B:
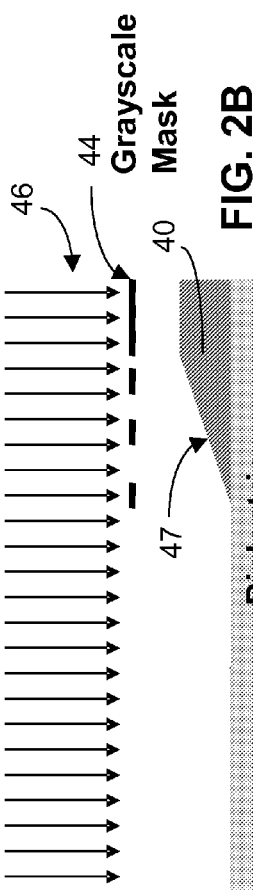

FIG. 2A is an elevation sectional view and shows layers 20 and the gate 24 covered by dielectric 36. The dielectric 36 is coated by photo resist 40. Then as shown in FIG. 2B a gray scale mask 44 is positioned above an area of photo resist 40, and next the photo resist 40 is exposed to light 46. The gray scale mask 44 provides a modulated light intensity across the photo resist 40, so that only a portion of photo resist 40 remains on the dielectric 36 after processing, as shown in FIG. 2B. The gray scale mask 44 has the effect of tapering the illumination intensity between the gate 24 and the drain 26 to create a sloped sidewall 47 on the remaining portion of photo resist 40. In one embodiment the illumination intensity is tapered to vary linearly between the gate 24 and the drain 26. In other embodiments the illumination intensity may be varied in non-linearly between the gate 24 and the drain 26.

Figure 2C:
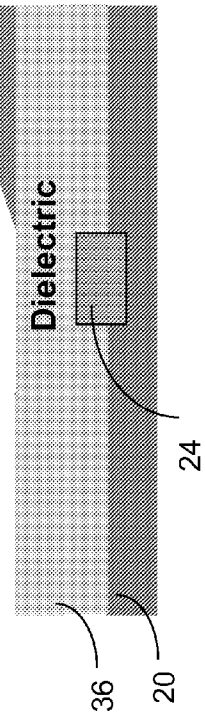

Next, as shown in FIG. 2C, the dielectric 36 and the remaining portion of photo resist 40 are etched, which transfers the sloped sidewall 47 pattern to the dielectric 36 to form sloped sidewall 32 on the dielectric 36. The etching may be performed using plasma dry etching, wet etching, or a combination of plasma dry etching and wet etching.

Figure 2D:
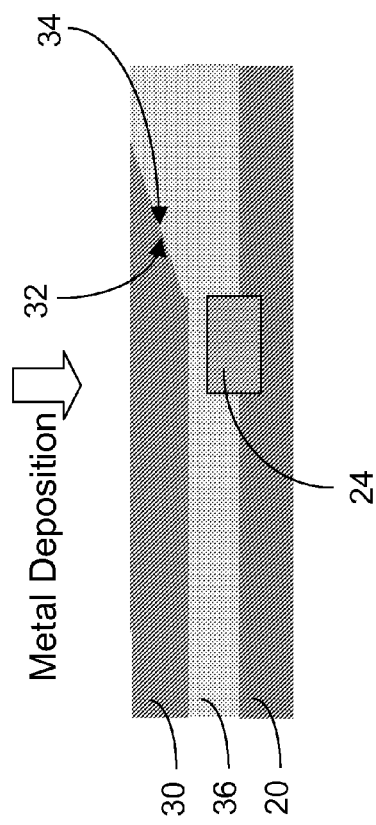

Then, as shown in FIG. 2D, metal is deposited to form the field plate 30. The metal deposited on the sloped sidewall 32 forms the sloped sidewall 34 on the field plate 30.

Figure 3:
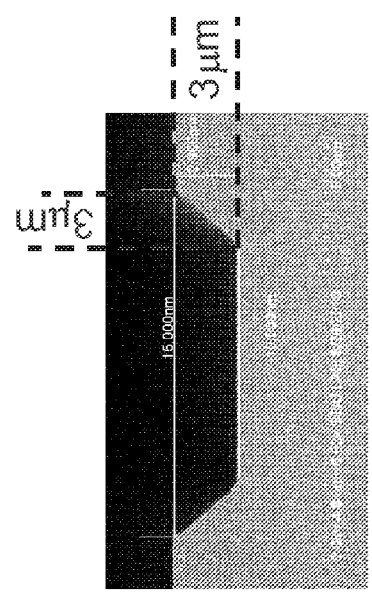
FIG. 3 shows a slanted trench formed using methods in accordance with the present disclosure.

FIG. 3 shows a slanted trench formed using the methods described above.

Figure 4A:
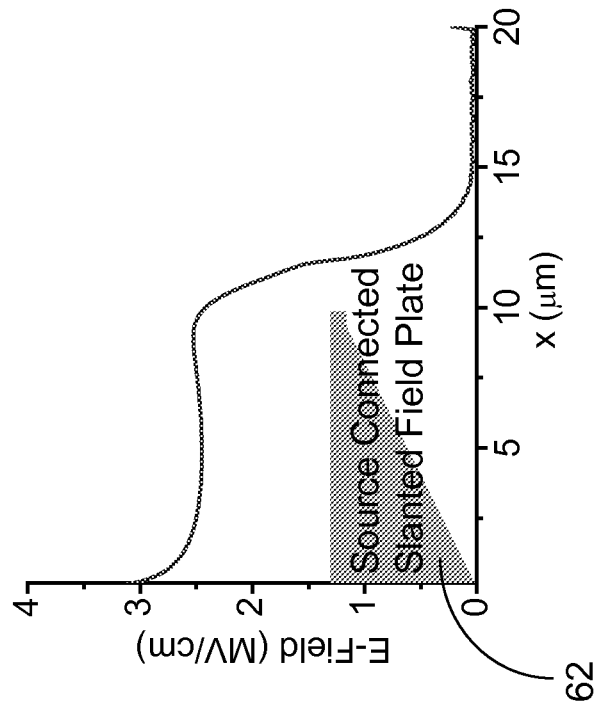
FIG. 4A shows a simulation of the electric-field for a conventional multiple-flat plate structure and FIG. 4B shows a simulation of the electric-field for a source connected slant field-plate structure in accordance with the present disclosure.
Figure 4B:
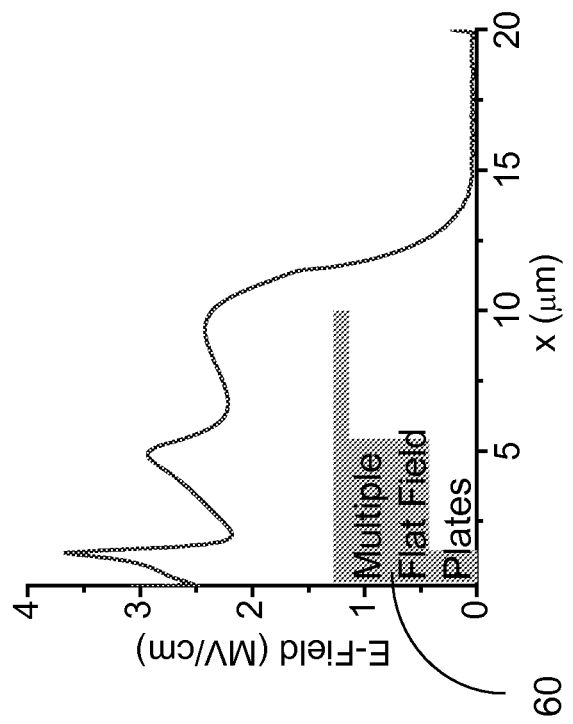
Figure 5:
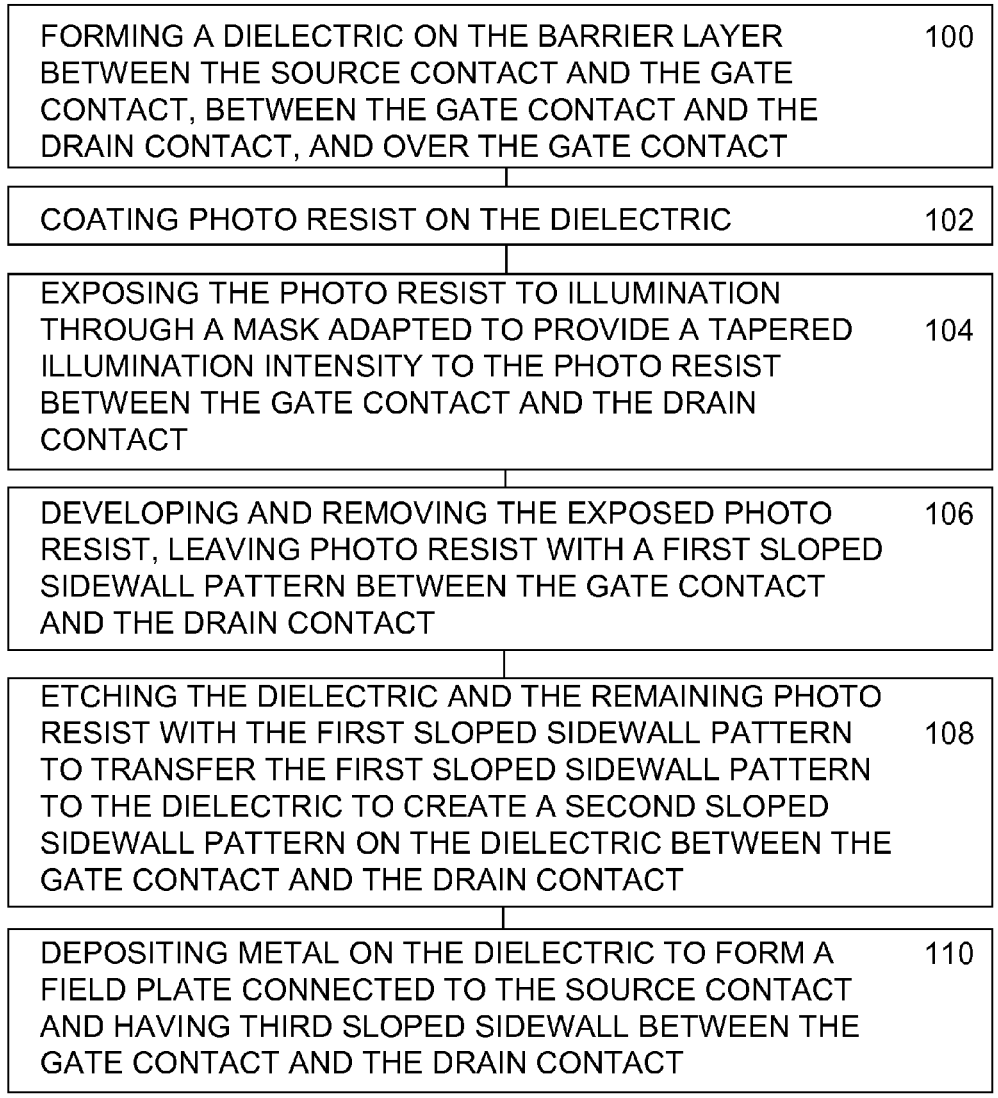
FIG. 5 is a flow diagram of a method of fabricating a source connected slant field plate in accordance with the present disclosure.

FIG. 4A shows a simulation of the electric-field for a conventional multiple flat plate structure. FIG. 4B shows a simulation of the electric-field for a source connected slant field-plate structure in accordance with the present disclosure. The field plate with a source connected sloped sidewall has a lower peak electric field, as can be seen by comparing FIG. 4A and 4B. The source connected slant field-plate 30 structure in accordance with the present disclosure is also easier to fabricate than the prior art multiple flat plate structure FIG. 5 is a flow diagram of a method of fabricating a source connected slant field plate in accordance with the present disclosure. In step 100 a dielectric 36 is formed on the barrier layer 18 between the source contact 22 and the gate contact 24, between the gate contact 24 and the drain contact 26, and over the gate contact 24. Then in step 102 photo resist 40 is coated on the dielectric 36. Next in step 104 the photo resist is exposed to illumination through a mask 44 adapted to provide a tapered illumination intensity to the photo resist between the gate contact and the drain contact. Then in step 106 the exposed photo resist is developed and removed, leaving photo resist with a first sloped sidewall pattern 47 between the gate contact and the drain contact. Next in step 108, the dielectric and the remaining photo resist with the first sloped sidewall pattern are etched to transfer the first sloped sidewall pattern 47 to the dielectric 36 to create a second sloped sidewall pattern 32 on the dielectric between the gate contact and the drain contact. Then in step 108 metal is deposited on the dielectric to form a field plate connected to the source contact and having third sloped sidewall 34 between the gate contact and the drain contact.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A field effect transistor (FET) having a source contact to a channel layer, a drain contact to the channel layer, and a gate contact on a barrier layer over the channel layer, the FET comprising:
    a dielectric layer on the barrier layer between the source contact and the drain contact and over the gate contact; and
    a field plate on the dielectric layer, the field plate connected to the source contact and extending over a space between the gate contact and the drain contact and the field plate comprising a sloped sidewall in the space between the gate contact and the drain contact.

2. The field effect transistor (FET) of claim 1 wherein a lateral dimension of the sloped sidewall between the gate contact and the drain contact is at least 1 micrometer.

3. The field effect transistor (FET) of claim 1 wherein the sloped sidewall is sloped such that near the gate contact the sloped sidewall is closer to the barrier layer than the sloped sidewall is farther away from the gate contact.

4. The field effect transistor (FET) of claim 1 wherein an angle of the sloped sidewall is approximately 30 degrees relative to a plane of the barrier layer.

5. The field effect transistor (FET) of claim 1 wherein the sloped sidewall is curved.

6. The field effect transistor (FET) of claim 1 wherein the sloped sidewall shapes the electric field between the gate contact and the drain contact.

7. The field effect transistor (FET) of claim 1 wherein the source contact, the gate contact, the drain contact, and the field plate are metal.

8. The field effect transistor (FET) of claim 1 wherein the dielectric layer covers a first trench between the source contact and the gate contact and a second trench between the gate contact and the drain contact.

9. The field effect transistor (FET) of claim 1 wherein the field plate is insulated from the gate contact and the drain contact by the dielectric.

10. A method of forming a field plate for a field effect transistor having a source contact to a channel layer, a drain contact to the channel layer, and a gate contact on a barrier layer over the channel layer, the method comprising:
    forming a dielectric layer on the barrier layer between the source contact and the drain contact and over the gate contact;
    coating photo resist on the dielectric;
    exposing the photo resist to illumination through a mask adapted to provide a tapered illumination intensity to the photo resist between the gate contact and the drain contact;
    developing and removing the exposed photo resist, leaving photo resist with a first sloped sidewall pattern between the gate contact and the drain contact;
    etching the dielectric and the remaining photo resist with the first sloped sidewall pattern to transfer the first sloped sidewall pattern to the dielectric to create a second sloped sidewall pattern on the dielectric between the gate contact and the drain contact; and
    depositing metal on the dielectric to form a field plate connected to the source contact and having third sloped sidewall between the gate contact and the drain contact.

11. The method of claim 10 wherein a lateral dimension of the third sloped sidewall between the gate contact and the drain contact is at least 1 micrometer.

12. The method of claim 10 wherein the third sloped sidewall is sloped such that the third sloped sidewall near the gate contact is closer to the barrier layer than the third sloped sidewall further away from gate contact.

13. The method of claim 10 wherein an angle of the third sloped sidewall is approximately 30 degrees relative to a plane of the barrier layer.

14. The method of claim 10 wherein the third sloped sidewall is curved.

15. The method of claim 10 wherein the third sloped sidewall shapes the electric field between the gate contact and the drain contact.

16. The method of claim 10 wherein the source contact, the gate contact, the drain contact, and the field plate are metal.

17. The method of claim 10 wherein the etching comprises plasma dry etching, wet etching, or plasma dry etching and wet etching.

18. The method of claim 10 wherein the mask comprises a gray scale mask.

19. The method of claim 10 wherein the mask comprises a portion that masks the illumination intensity to vary linearly between the gate contact and the drain contact.

20. The method of claim 10 wherein the field plate is insulated from the gate contact and the drain contact by the dielectric.

* * * * *